(12) United States Patent
Kang

(10) Patent No.: US 11,061,614 B2
(45) Date of Patent: Jul. 13, 2021

(54) ELECTRONIC APPARATUS HAVING DATA RETENTION PROTECTION AND OPERATING METHOD THEREOF

(71) Applicant: SK hynix Inc., Gyeonggi-do (KR)

(72) Inventor: Chui Sung Kang, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 112 days.

(21) Appl. No.: 16/658,444

(22) Filed: Oct. 21, 2019

(65) Prior Publication Data
US 2020/0167096 A1    May 28, 2020

(30) Foreign Application Priority Data

Nov. 23, 2018    (KR) .......................... 10-2018-0146727

(51) Int. Cl.
*G06F 3/06* (2006.01)
*G11C 5/00* (2006.01)
*G11C 7/10* (2006.01)

(52) U.S. Cl.
CPC .......... *G06F 3/0659* (2013.01); *G06F 3/0604* (2013.01); *G06F 3/0673* (2013.01); *G11C 5/005* (2013.01); *G11C 7/1051* (2013.01)

(58) Field of Classification Search
CPC .................................................. G06F 3/0659
USPC ........................................................... 711/154
See application file for complete search history.

(56) References Cited

U.S. PATENT DOCUMENTS

| | | | |
|---|---|---|---|
| 6,606,261 B2 * | 8/2003 | Gudesen | G11C 11/22 365/145 |
| 2011/0208990 A1 * | 8/2011 | Zerbe | G06F 1/08 713/501 |

FOREIGN PATENT DOCUMENTS

KR    1020140103755    8/2014

\* cited by examiner

*Primary Examiner* — Jae U Yu
(74) *Attorney, Agent, or Firm* — IP & T Group LLP

(57) ABSTRACT

An electronic apparatus includes a storage device having a plurality of memory blocks including a first memory block; and a controller configured to control the storage device to perform a read operation for the first memory block in response to a read request of a host. The controller controls the storage device to perform a refresh operation for the first memory block based on whether there is a difference value between a current pass read voltage and a previous pass read voltage which were applied to the first memory block when performing the read operation, and whether there is a difference between a current erase/write count and a previous erase/write count for the first memory block.

18 Claims, 13 Drawing Sheets

245

| BLK | Current E/W Count | Previous Pass Read Voltage | Previous E/W Count |
|---|---|---|---|
| 1 | ~ | ~ | ~ |
| 2 | ~ | ~ | ~ |
| ⋮ | ⋮ | ⋮ | ⋮ |
| K (i X j) | ~ | ~ | ~ |

BLK1

☐ First charge leakage state

245

| BLK | Current E/W Count | Previous Pass Read Voltage | Previous E/W Count |
|---|---|---|---|
| 1 | 1 | vr2 | 1 |
| 2 | - | - | - |
| ⋮ | ⋮ | ⋮ | ⋮ |
| K (i × j) | - | - | - |

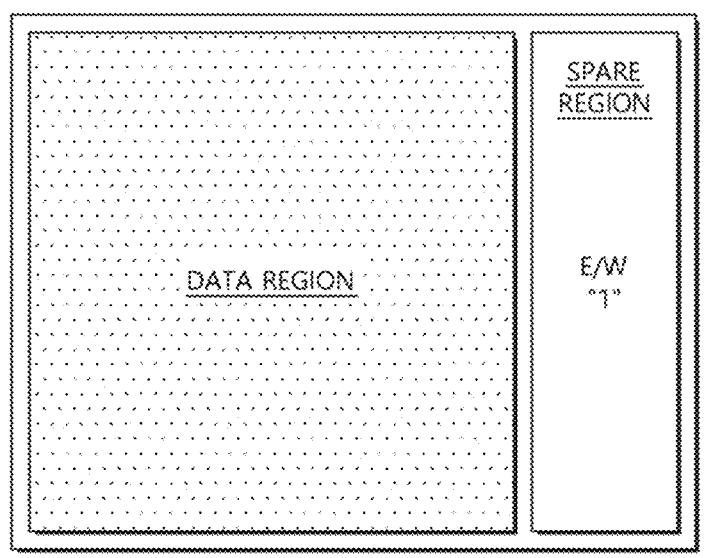

FIG.8C
245
| BLK | Current E/W Count | Previous Pass Read Voltage | Previous E/W Count |
|---|---|---|---|
| 1 | 2 | vr2 | 1 |
| 2 | - | - | - |
| ⋮ | ⋮ | ⋮ | ⋮ |
| K (i X j) | - | - | - |
FIG.9
BLK1
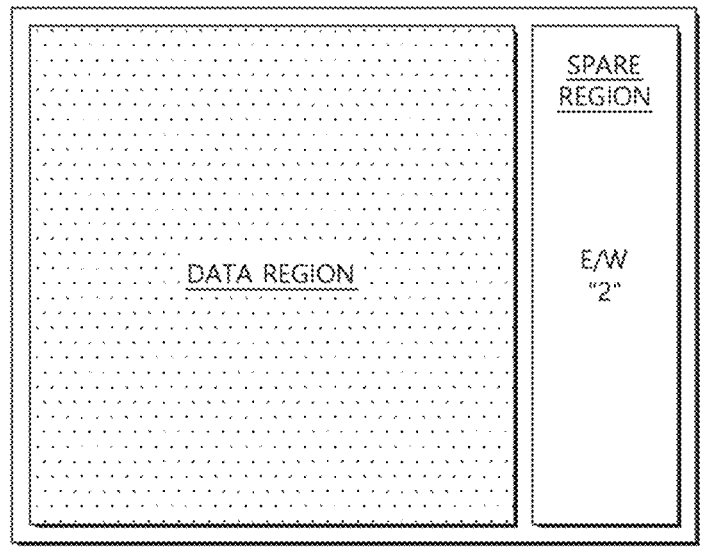
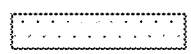 Second charge leakage state

ELECTRONIC APPARATUS HAVING DATA RETENTION PROTECTION AND OPERATING METHOD THEREOF

CROSS-REFERENCES TO RELATED APPLICATION

The present application claims priority under 35 U.S.C. § 119(a) to Korean application number 10-2018-0146727, filed on Nov. 23, 2018, which is incorporated herein by reference in its entirety.

BACKGROUND

1. Technical Field

Various embodiments of the present disclosure generally relate to an electronic apparatus. Particularly, the embodiments relate to an electronic apparatus including a data storage device and an operating method thereof.

2. Related Art

Recently, the paradigm for the computer environment has changed to ubiquitous computing in which computer systems can be used anytime and anywhere. As a result, the use of portable electronic appliances such as mobile phones, digital cameras, and notebook computers has rapidly increased. Such portable electronic appliances use an electronic apparatus including a data storage device, to store data.

An electronic apparatus including a data storage device provides advantages in that, since there is no mechanical driving part, stability and durability are excellent, and information access speed is high while power consumption is low. Electronic apparatuses include a universal serial bus (USB) memory device, memory cards having various interfaces, a universal flash storage (UFS) device, and a solid state drive (SSD). However, in the current state of the art, data retention characteristics of memory blocks which are included in data storage devices, can deteriorate over time which decreases the reliability and lifetime of a data storage device, and render the data storage device unusable. Therefore, a data storage device having data retention protection which increases the reliability and lifetime of the data storage device, is needed.

SUMMARY

Various embodiments are directed to an electronic apparatus capable of preventing the loss of data and an operating method thereof.

In an embodiment, an electronic apparatus may include: a storage device having a plurality of memory blocks including a first memory block; and a controller configured to control the storage device to perform a read operation for the first memory block in response to a read request of a host. The controller controls the storage device to perform a refresh operation for the first memory block based on whether there is a difference value between a current pass read voltage and a previous pass read voltage which were applied to the first memory block when performing the read operation, and whether there is a difference between a current erase/write count and a previous erase/write count for the first memory block.

In an embodiment, a memory system may include: a memory device including a memory block; and a controller configured to store a previous pass read voltage, a current erase/write count, and a previous erase/write (EW) count of the memory block; and control the memory device to perform a refresh operation to the memory block when a difference between the current pass read voltage and the previous pass read voltage is greater than a predetermined threshold and the current EW count and the previous EW count are equal.

In an embodiment, an electronic apparatus may include: a data storage device including a plurality of memory blocks; and a controller including a retention manager, and configured to control the data storage device to perform a read operation on a first memory block among the plurality of memory blocks in response to a read request from a host. The retention manager compares a pass read voltage applied to the first memory block in the current read operation with a stored previous pass read voltage applied to the first memory block during a last previous read operation to determine a voltage difference value when a current read operation is determined to be a success. The retention manager determines a current erase/write count for the first memory block and compares the current erase/write count with a stored previous erase/write count for the first memory block when the voltage difference value is greater than or equal to a preset voltage threshold value, and performs a refresh operation for the first memory block when the current erase/write count is equal to the stored previous erase/write count.

In an embodiment, a method for operating an electronic apparatus, the method may include: performing a read operation for a first memory block in response to a read request from a host; determining whether there is a difference value between a current pass read voltage and a previous pass read voltage which were applied to the first memory block by the read operation, and whether there is a difference between a current erase/write count and a previous erase/write count for the first memory block; and performing a refresh operation for the first memory block depending on a determination result.

In an embodiment, an operating method of a controller for controlling a memory device including a memory block, the operating method may include: storing a previous pass read voltage, a current erase/write count (EW), and a latest previous erase/write (EW) count of the memory block when a current read operation is performed on the memory block; and controlling the memory device to perform a refresh operation to the memory block when a difference value between a current pass read voltage and the previous pass read voltage is greater than a predetermined threshold, and the current and latest previous EW counts are equal.

In an embodiment, a method for data retention protection in an electronic apparatus, the method may include: performing a current read operation, by a data storage device having a plurality of memory blocks and controlled by a controller which includes a retention manager, in response to a read request from a host; comparing by the retention manager, a pass read voltage which is applied in the current read operation to a first memory block among the plurality of memory blocks, with a stored previous pass read voltage applied to the first memory block during a last previous read operation to determine a voltage difference value, when the current read operation is determined to be a success; determining by the retention manager, a current erase/write count for the first memory block; comparing by the retention manager, the current erase/write count with a stored previous erase/write count for the first memory block, when the voltage difference value is greater than or equal to a preset voltage threshold value; and performing a refresh operation for the first memory block, by the retention manager when the current erase/write count is equal to the stored previous erase/write count.

According to the embodiments of the disclosure, based on the difference between a previous pass read voltage and a current pass read voltage for the same memory block, it is possible to determine whether to perform a refresh operation for the same memory block and then, if necessary, perform the refresh operation. Due to this fact, it is possible to prevent the data stored in the memory block from entering into an unrecoverable state.

Moreover, if it is determined to perform a refresh operation for at least one memory block, a scan operation for checking whether to perform a refresh operation for the remaining memory blocks may be performed in a background operation, and if necessary, the refresh operation may be performed, whereby the lifetime of an electronic apparatus may be increased.

BRIEF DESCRIPTION OF THE DRAWINGS

FIG. 7 is a diagram illustrating a second charge leakage state for the first memory block after a second amount of time elapses.

FIG. 8C is a diagram illustrating a block state table having a corresponding value changed when the program operation for the reallocated first memory block is completed.

FIG. 9 is a diagram illustrating a second charge leakage state for the reallocated first memory block after a second amount of time elapses.

DETAILED DESCRIPTION

Figure 1:
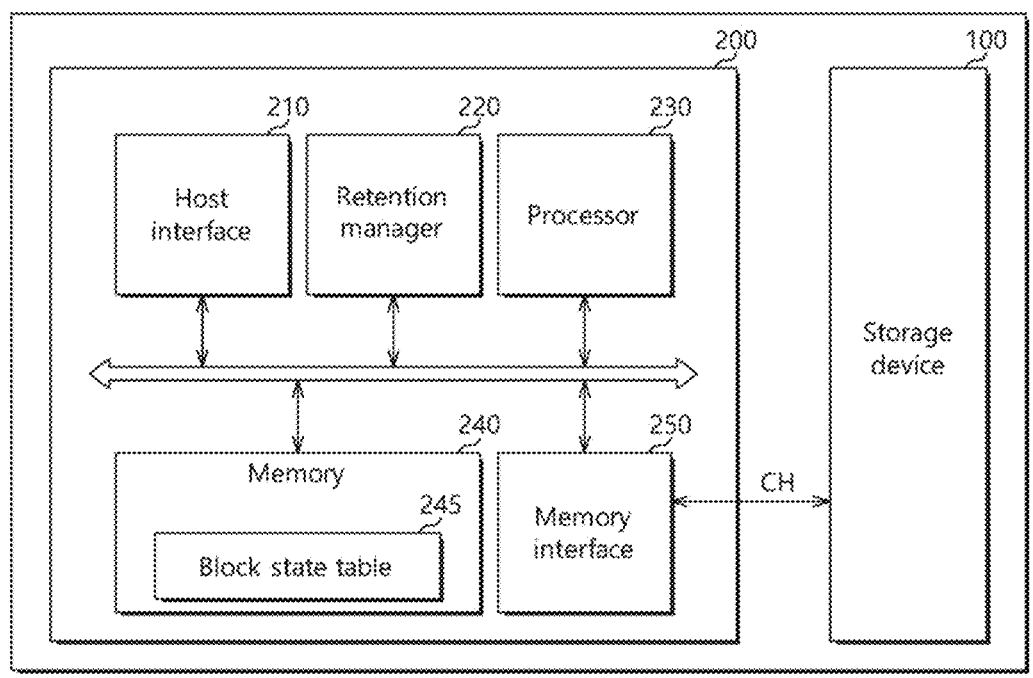
FIG. 1 is a diagram illustrating a configuration of an electronic apparatus in accordance with an embodiment of the disclosure.

Various embodiments of the present invention are described below in more detail with reference to the accompanying drawings. We note, however, that the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It is noted that reference to "an embodiment," "another embodiment" or the like does not necessarily mean only one embodiment, and different references to any such phrase are not necessarily to the same embodiment(s).

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

Hereinafter, an electronic apparatus and an operating method thereof will be described below with reference to the accompanying drawings through various examples of embodiments.

FIG. 1 is a block diagram illustrating a configuration of an electronic apparatus 10 in accordance with an embodiment of the disclosure. In the present embodiment, the electronic apparatus 10 may store data to be accessed by a host (not illustrated) such as a mobile phone, an MP3 player, a laptop computer, a desktop computer, a game machine, a TV and an in-vehicle infotainment system. The electronic apparatus 10 may also be referred to as a memory system.

The electronic apparatus 10 may be manufactured as any one of various types of storage devices according to a host interface which is a transmission protocol for the host. For example, the electronic apparatus 10 may be configured as any one of various types of storage devices such as a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card and a memory stick.

The electronic apparatus 10 may be manufactured as any one among various package types. For example, the electronic apparatus 10 may be manufactured as any one of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

Referring to FIG. 1, the electronic apparatus 10 may include a storage device 100 and a controller 200.

The storage device 100 may operate as the storage medium of the electronic apparatus 10. The storage device 100 may include a non-transitory machine-readable storage medium. The storage device 100 may be configured by using any one of various types of nonvolatile memory devices such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PRAM) using a chalcogenide alloy, and a resistive random access memory (RERAM) using a transition metal compound.

Figure 2A:
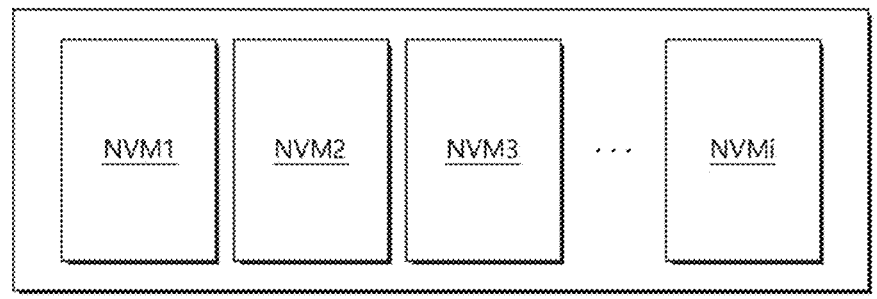
FIG. 2A is a diagram illustrating a configuration of the storage device illustrated in FIG. 1.
Figure 2B:
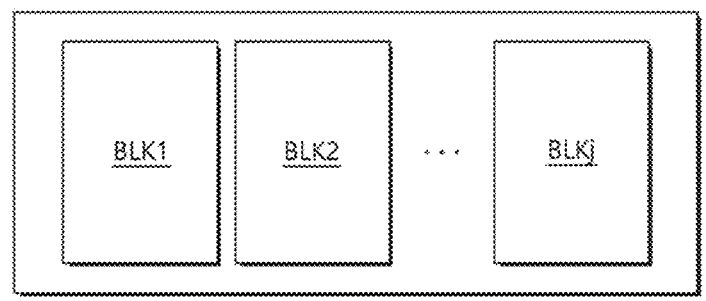
FIG. 2B is a diagram illustrating a configuration of each of the nonvolatile memory devices illustrated in FIG. 2A.
Figure 2C:
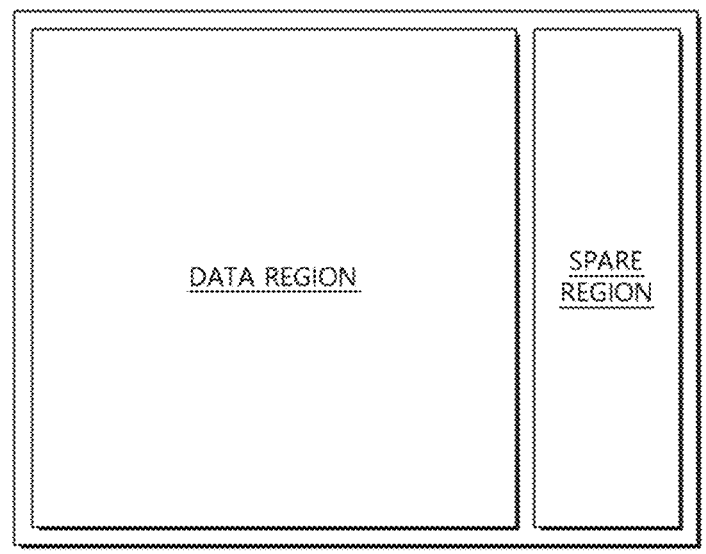
FIG. 2C is a diagram illustrating a configuration of each of the memory blocks illustrated in FIG. 2B.

FIG. 2A is a diagram illustrating a configuration of the storage device 100, FIG. 2B is a diagram illustrating the configuration of any one among the plurality of nonvolatile memory devices NVM1 to NVMi shown in FIG. 2A, and FIG. 2C is a diagram illustrating the configuration of any one among the plurality of memory blocks BLK1 to BLKj shown in FIG. 2B.

Referring to FIG. 2A, the storage device 100 may include a plurality of nonvolatile memory devices NVM1 to NVMi. A number of channels CH (not shown) corresponding to the number of nonvolatile memory devices NVM1 to NVMi included in the storage device 100 are coupled with the controller 200. However, the embodiment is not specifically limited thereto. Furthermore, each of the nonvolatile memory devices NVM1 to NVMi may be coupled with the controller 200 through one channel CH, but the embodiment is not specifically limited thereto.

Referring to FIGS. 2B and 2C, each nonvolatile memory device NVM may include a plurality of memory blocks BLK1 to BLKj. Each memory block BLK may include a data region where data such as user data is stored, and a spare region where metadata related with the data are stored. For example, an erase/write (E/W) count may be stored in the spare region. While not specifically illustrated in FIG. 2C, each memory block BLK may include a plurality of pages.

While not specifically illustrated in FIG. 2B, each nonvolatile memory device NVM may include a memory cell array (not illustrated) which has a plurality of memory cells respectively disposed at regions where a plurality of bit lines (not illustrated) and a plurality of word lines (not illustrated) intersect with each other. Each memory cell of the memory cell array may be a single level cell (SLC) storing one bit, a multi-level cell (MLC) capable of storing 2-bit data, a triple level cell (TLC) capable of storing 3-bit data or a quadruple level cell (QLC) capable of storing 4-bit data. The memory cell array may include at least one of single level cells, multi-level cells, triple level cells and quadruple level cells. For example, the memory cell array may include memory cells of a two-dimensional horizontal structure or memory cells of a three-dimensional vertical structure.

Referring back to figure FIG. 1, the controller 200 may include a host interface 210, a retention manager 220, a processor 230, a memory 240 and a memory interface 250. The memory 240 may include a block state table 245.

The host interface 210 may interface the host and the electronic apparatus 10. For example, the host interface 210 may communicate with the host by using any one of standard transmission protocols such as universal serial bus (USB), universal flash storage (UFS), multimedia card (MMC), parallel advanced technology attachment (PATA), serial advanced technology attachment (SATA), small computer system interface (SCSI), serial attached SCSI (SAS), peripheral component interconnection (PCI) and PCI express (PCI-E) protocols.

The retention manager 220 may be driven under the control of the processor 230. The retention manager 220 may be realized by hardware, software or a combination of hardware and software. The retention manager 220 may determine whether to perform a refresh operation for each of the memory blocks BLK1 to BLKj of the storage device 100, and may provide a determination result to the processor 230.

For example, depending on whether an error correct code (ECC) decoding of data read out from a memory block read-requested from the host, is a pass or a fail, the retention manager 220 may determine whether to perform a refresh operation for that memory block.

If the ECC decoding of the data read out from the memory block read-requested from the host is a fail, the retention manager 220 may provide the processor 230 with a signal indicating that a refresh operation for that memory block is necessary. Based on the signal received from the retention manager 220, the processor 230 may control the storage device 100 to perform a series of processes of reading out data stored in the memory block, correcting error bits of the read-out data, and storing error bit-corrected data in another memory block.

If the ECC decoding of the data read out from the memory block read-requested from the host is a pass, the retention manager 220 may compare a current read voltage level (hereinafter, referred to as a 'pass read voltage') used in reading out the data which passed the ECC decoding with a previous pass read voltage used for the same memory block, and may determine whether the difference between the read voltages is less than, equal to, or greater than a preset threshold value. If the difference between the read voltages is less than the preset threshold value, the retention manager 220 may determine that a refresh operation for that memory block is not necessary, and no signal is provided to the processor 230.

If the difference between the read voltages is equal to or greater than the preset threshold value, the retention manager 220 may determine a current erase/write count for the memory block and compare the current erase/write (E/W) count for that memory block and a previous erase/write (E/W) count corresponding to the previous pass read voltage for that memory block, and may determine whether the erase/write (E/W) count has increased. If the erase/write count has increased, the retention manager 220 may determine that the memory block is a memory block in which new data is stored after the memory block was erased, and no signal is provided to the processor 230.

Conversely, if the current erase/write count and the previous erase/write count of the corresponding memory block are equal, the retention manager 220 may determine that the retention characteristic of that memory block has deteriorated, and may provide the processor 230 with a signal indicating that a refresh operation for that memory block is necessary.

The retention manager 220 may provide the processor 230 with a signal indicating that it is necessary to perform a refresh operation for the memory block, and at the same time, may provide the processor 230 with a signal indicating that it is necessary to perform a retention scan operation for each of the remaining memory blocks except for the memory block which is being refreshed.

The retention scan operation for each of the remaining memory blocks may be performed as a background operation while the electronic apparatus 10 is in an idle state, is booted, or an operation such as garbage collection (GC) is performed in the storage device 100. However, the embodiment is not specifically limited thereto.

The processor 230 may be configured by a micro control unit (MCU) or a central processing unit (CPU). The processor 230 may process a request received from the host. In order to process the request received from the host, the processor 230 may drive a code type instruction or algorithm, that is, software which is loaded in the memory 240, and may control internal function blocks and the storage device 100.

The electronic apparatus 10 starts a boot-up process when supplied with power or is rebooted. For example, the electronic apparatus 10 reads out a bootloader from a read only memory (ROM) (not illustrated), and loads the bootloader in the memory 240. The electronic apparatus 10 may complete the boot-up process by reading out code type instructions from the storage device 100 and loading the code type instructions in the memory 240, using the bootloader. The code type instructions loaded in the memory 240 may control the operations of the various function blocks in the controller 200 and of the storage device 100.

When an ECC decoding for data read out from the storage device 100 in response to a read request from the host is a pass or a fail, the processor 230 may drive the retention manager 220 to determine whether to perform a refresh operation for the memory block read-requested from the host. Based on the determination result, the retention manager 220 may or may not perform the refresh operation for that memory block.

The memory 240 may be configured by a dynamic random access memory (DRAM) or a static random access memory (SRAM). The memory 240 may include a region in which software (that is, code type instructions) is loaded which will be driven by the processor 230. Furthermore, the memory 240 may include a region where metadata necessary to drive the software is stored. Namely, the memory 240 may operate as a working memory of the processor 230.

The memory 240 may include a region which temporarily stores data to be transmitted from the host to the storage device 100, or data to be read out from the storage device 100 and then transmitted to the host. That is, the memory 240 may operate as a buffer memory, and may also be referred to as a temporary storage device.

The block state table 245 stored in the memory 240 may be configured to include state information for the respective memory blocks included in the storage device 100.

Figures 3, 4:
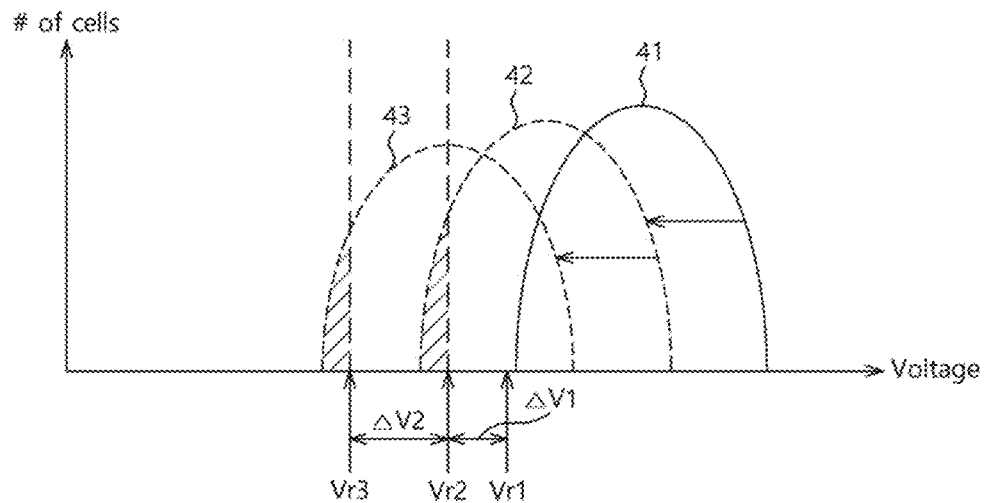
FIG. 3 is a diagram illustrating the block state table illustrated in FIG. 1.
FIG. 4 is a diagram illustrating threshold voltage distributions that are changed due to deteriorations in a retention characteristic.

FIG. 3 is a diagram illustrating the block state table 245.

Referring to FIG. 3, the block state table 245 may be configured to store a current erase/write (E/W) count, a previous pass read voltage, and a previous erase/write (E/W) count for each memory block. The current erase/write count may be increased at a time when an erase operation and a program operation for a memory block allocated as an open block (that is, a block to be used in a write operation), are performed.

The previous pass read voltage may represent a read voltage which is applied to read out data, when an ECC decoding of the data read out from a memory block is a pass during the previous read operation on the memory block. That is, the previous pass read voltage may represent the latest pass read voltage applied for the previous read operation on a memory block prior to the current read operation.

The previous erase/write (E/W) count may represent an erase/write count of the memory block at a time when the previous pass read voltage is applied. That is, the previous E/W count may indicate the E/W count at a time when the previous pass read voltage was applied (i.e., at a time of a successful previous read operation to the memory block).

The current erase/write (E/W) count, the previous pass read voltage, and the previous erase/write (E/W) count of the block state table 245 may be updated in real time. The updated block state table 245 may be backed up in the storage device 100. Upon booting of the electronic apparatus 10, the block state table 245 backed up in the storage device 100 may be loaded in the memory 240.

The memory interface 250 may control the storage device 100 under the control of the processor 230. The memory interface 250 may also be referred to as a memory controller. The memory interface 250 may provide control signals to the storage device 100. The control signals may include a command for controlling the storage device 100 to perform an operation corresponding to a request received from the host. The command may include an operation code (for example, information on the type of the operation to be performed), address information on a region where the operation is to be performed, and so forth, but the embodiment is not specifically limited thereto. The memory interface 250 may provide data to the storage device 100, or may be provided with data from the storage device 100. The memory interface 250 may be coupled with the storage device 100 through one or more channels CH.

FIG. 4 is a diagram illustrating threshold voltage distributions 41 to 43 that are changed due to deteriorations in a retention characteristic. While one threshold voltage distribution is illustrated as an example in FIG. 4, other threshold voltage distributions may be formed. Depending on which storage scheme is used, e.g., the SLC scheme, the MLC scheme, the TLC scheme or the QLC scheme, a minimum of 2 threshold voltage distributions may be formed.

After a program operation is performed for memory cells, if access to the programmed memory cells is not made for a long time, the charges stored in the programmed memory cells leak due to the lapse of time. As a result, a threshold voltage distribution may be changed as illustrated in FIG. 4.

In FIG. 4, a first threshold voltage distribution 41 represents an initial state in which memory cells are programmed. At this time, when a first read voltage Vr1 is applied, an ECC decoding of first data read out from the memory cells will be a pass.

A second threshold voltage distribution 42 represents a state which is shifted towards the left due to the leakage of charges occurring during the lapse of a first amount of time and is relatively wide in its width. At this time, the number of error bits included in the first data read out by the first read voltage Vr1 may be greater than the number of correctable error bits, and as a result, an ECC decoding of the first data will be a fail. Therefore, data is read out again from the memory cells by applying a changed read voltage, that is, a second read voltage Vr2. The number of error bits (corresponding to the hatched portion) included in read-out second data may be less than the number of correctable error bits, and as a result, an ECC decoding of the second data will be a pass.

A third threshold voltage distribution 43 represents a state which is further shifted towards the left due to the leakage of charges occurring during the lapse of a second amount of time greater than the first amount of time, and is further wider in its width. At this time, the number of error bits included in the second data read out by the second read voltage Vr2 as the latest previous pass read voltage may be substantially greater than the number of correctable error bits, and as a result, an ECC decoding of the second data will be a fail. Therefore, data is read out again from the memory cells by applying a changed read voltage, that is, a third read voltage Vr3. The number of error bits (corresponding to the hatched portion) included in read-out third data may be less than the number of correctable error bits, and as a result, an ECC decoding of the third read data will be a pass.

While only the three read voltages Vr1, Vr2 and V3 are illustrated in FIG. 4, it will be apparent to a person skilled in the art to change a read voltage until an ECC decoding of read data is passed, or to change the read voltage a predetermined number of times and then to repeatedly read out data from memory cells by using the changed read voltage.

As illustrated in FIG. 4, it can be seen that the difference ΔV2 between the second read voltage Vr2 and the third read voltage Vr3 is substantially greater than the difference ΔV1 between the first read voltage Vr1 and the second read voltage Vr2. That is, the difference between a previous pass read voltage and a current pass read voltage may represent the retention characteristic of memory cells. For example, if the difference between a previous pass read voltage and a current pass read voltage increases, it may indicate that the retention characteristic of the memory cells has deteriorated.

Thus, in the present embodiment, the retention manager 220 compares the difference between a previous pass read voltage and a current pass read voltage with a preset threshold value. The retention manager then determines, when the difference is equal to or greater than the preset threshold value, that the retention characteristic of a memory block has deteriorated, and provides a signal to the processor 230 such that a refresh operation is performed for the memory block before the retention characteristic further deteriorates. By performing a refresh operation in advance before the retention characteristic of a memory block deteriorates to such an extent that it cannot be recovered, it is possible to improve the reliability of data and increase the lifetime of the storage device 100.

Figures 5A, 5B, 5C:
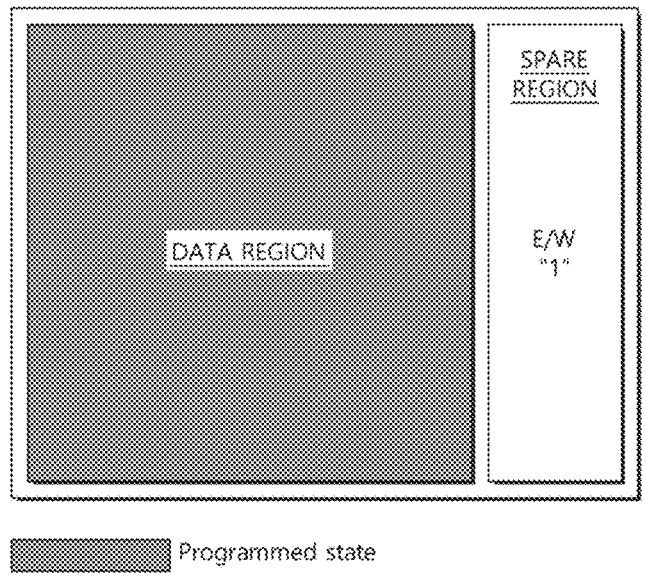
FIG. 5A is a diagram illustrating a state after a program operation for a first memory block illustrated in FIG. 2B is completed.
FIG. 5B is a diagram illustrating a block state table having a corresponding value changed when the program operation for the first memory block is completed.
FIG. 5C is a diagram illustrating a block state table having a corresponding value changed when a read operation is a pass for the first memory block being in a programmed state.

FIG. 5A is a diagram illustrating a state in which a program operation for a first memory block BLK1 is completed, FIG. 5B is a diagram illustrating the block state table 245 in which a corresponding value is changed as the program operation for the first memory block BLK1 is completed, and FIG. 5C is a diagram illustrating the block state table 245 in which a corresponding value is changed when a read operation for the first memory block BLK1 being in a programmed state is a pass. Furthermore, the first memory block BLK1 is allocated for the first amount of time as an open block.

While not specifically illustrated in FIG. 5A, an erase operation for the first memory block BLK1 which is allocated as an open block, may be performed first. However, the embodiment is not specifically limited thereto. When data corresponding to a write request from the host is stored in the data region of the first memory block BLK1 which is in an erased state, an erase/write count '1' may be stored in the spare region of the first memory block BLK1. At this time, as illustrated in FIG. 5B, '1' is stored as a current erase/write count for the first memory block BLK1, in the block state table 245.

Thereafter, if an ECC decoding of data read out from the first memory block BLK1 by the first read voltage Vr1 (see FIG. 4) in response to a read request received from the host, is a pass, as illustrated in FIG. 5C, 'Vr1' is stored as a previous pass read voltage for the first memory block BLK1 and '1' is stored as a previous erase/write count, in the block state table 245.

Figures 6A, 6B:
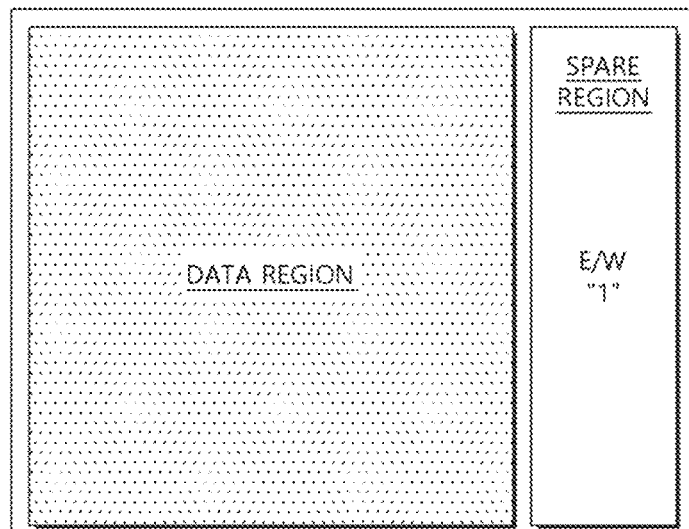
FIG. 6A is a diagram illustrating a first charge leakage state for the first memory block after a first amount of time elapses.
FIG. 6B is a diagram illustrating a block state table having a corresponding value changed when a read operation is a pass for the first memory block being in the first charge leakage state.

FIG. 6A is a diagram illustrating a first charge leakage state for the first memory block BLK1 after a first amount of time elapses, and FIG. 6B is a diagram illustrating the block state table 245 in which a corresponding value is changed when a read operation is a pass for the first memory block BLK1 being in the first charge leakage state.

If the first amount of time elapses after programming, as charges gradually leak from the memory cells of the first memory block BLK1, a state similar to the second threshold voltage distribution 42 illustrated in FIG. 4 may result. When a read request for the first memory block BLK1 is received from the host, data is read out from the first memory block BLK1 by using a previous pass read voltage first. If an ECC decoding of the read-out data is a fail, data is read out again from the first memory block BLK1 by changing the read voltage. For example, if an ECC decoding of data read out by the first read voltage Vr1 (see FIG. 4), which is the previous pass read voltage, is a fail and an ECC decoding of data read out by the changed second read voltage Vr2 (see FIG. 4) is a pass, as illustrated in FIG. 6B, the previous pass read voltage for the first memory block BLK1 may be updated to 'Vr2' and a previous erase/write count may not be changed, in the block state table 245.

At this time, the retention manager 220 may calculate the difference value between the second read voltage Vr2 as the current pass read voltage and the first read voltage Vr1 as the previous pass read voltage, and may determine whether the calculated difference value is less than, equal to, or greater than a preset threshold value. If the difference value is less than the threshold value, it is determined that it is not necessary to perform a refresh operation. If the difference value is equal to or greater than the threshold value, the necessity to perform a refresh operation may be determined depending on whether a current erase/write count has increased in comparison with the previous erase/write count.

FIG. 7 is a diagram illustrating a second charge leakage state for the first memory block BLK1 after a second amount of time elapses.

If the second amount of time, which is greater than the first amount of time, elapses after programming, as charges gradually leak from the memory cells of the first memory block BLK1, a state like the third threshold voltage distribution 43 illustrated in FIG. 4 may result. If a read request for the first memory block BLK1 is received from the host, data is read out from the first memory block BLK1 by using a previous pass read voltage first. If an ECC decoding of the read-out data is a fail, data is read out again from the first memory block BLK1 by changing the read voltage. For example, if an ECC decoding of the read data read out by the second read voltage Vr2 as the previous pass read voltage is a fail and an ECC decoding of the read data read out by the changed third read voltage Vr3 (see FIG. 4) is a pass, the previous pass read voltage for the first memory block BLK1 may be updated to 'Vr3' in the block state table 245.

The retention manager 220 may calculate the difference value between the third read voltage Vr3 as the current pass read voltage and the second read voltage Vr2 as the previous pass read voltage, and may determine whether the calculated difference value is less than, equal to, or greater than a preset threshold value. If the difference value is less than the threshold value, it is determined that it is not necessary to perform a refresh operation. If the difference value is equal to or greater than the threshold value, the necessity to perform a refresh operation may be determined depending on whether a current erase/write count has increased in comparison with a previous erase/write count.

For example, since the current erase/write count is the same as the previous erase/write count in FIG. 7, the retention manager 220 may determine that it is necessary to perform a refresh operation.

Figure 8A:
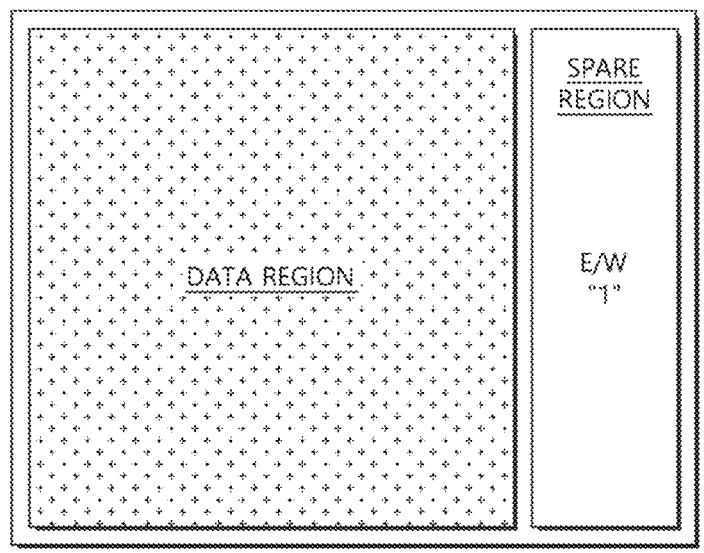
FIG. 8A is a diagram illustrating an invalidated state of the data stored in the first memory block.
Figure 8B:
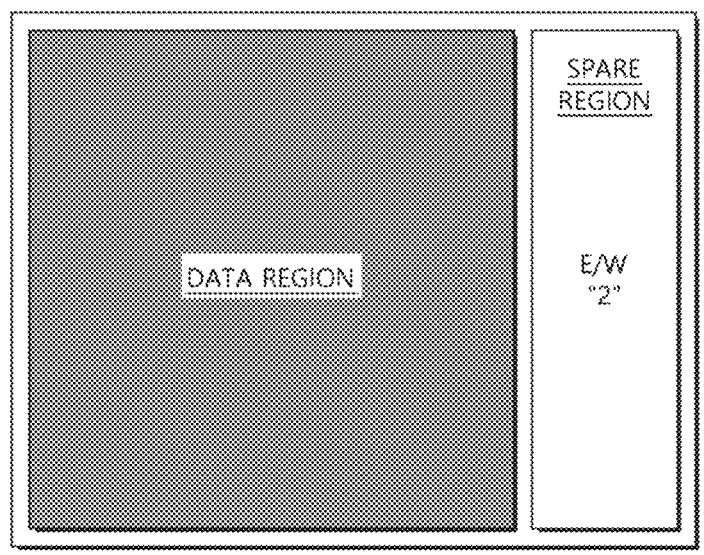
FIG. 8B is a diagram illustrating a state when a program operation is completed after an erase operation for a reallocated first memory block.

FIG. 8A is a diagram illustrating an invalidated state of the data stored in the first memory block BLK1, FIG. 8B is a diagram illustrating a state when a program operation is completed after an erase operation for the reallocated first memory block BLK1, and FIG. 8C is a diagram illustrating the block state table 245 in which a corresponding value is changed as the program operation for the reallocated first memory block BLK1 is completed.

If a write request including logical addresses corresponding to data stored in the first memory block BLK1 is received from the host, the data is stored in another memory block other than the first memory block BLK1, and the data already stored in the first memory block BLK1 becomes invalid data as illustrated in FIG. 8A. The first memory block BLK1 including the invalid data may be classified as a 'free block' indicating that the block is a usable block.

FIG. 8B illustrates a state in which the first memory block BLK1 classified as a free block is programmed after being reallocated as an open block. While not specifically illustrated in FIG. 8B, the reallocated first memory block BLK1 may be programmed after it becomes an erased state by an erase operation. Since the erase operation and the program operation have been performed sequentially for the first memory block BLK1, as illustrated in FIG. 8C, a current erase/write count for the first memory block BLK1 is updated to '2' in the block state table 245.

FIG. 9 is a diagram illustrating a second charge leakage state for the reallocated first memory block BLK1 after a second amount of time elapses.

If the second amount of time elapses after programming, the memory cells of the first memory block BLK1 may have a state like the third threshold voltage distribution 43 illustrated in FIG. 4. An ECC decoding of data read out by the second read voltage Vr2 as a previous pass read voltage, in response to a read request for the first memory block BLK1 received from the host, may be a fail, and an ECC decoding of data read out by the changed third read voltage Vr3 (see FIG. 4) may be a pass.

The retention manager 220 may calculate the difference value between the third read voltage Vr3 as the current pass read voltage and the second read voltage Vr2 as the previous pass read voltage, and may determine whether the calculated difference value is less than, equal to, or greater than a preset threshold value. If the difference value is less than the threshold value, it is determined that it is not necessary to perform a refresh operation. If the difference value is equal to or greater than the threshold value, the necessity to perform a refresh operation may be determined depending on whether a current erase/write count has increased in comparison with a previous erase/write count.

For example, since the current erase/write count is increased in comparison with the previous erase/write count in FIG. 9, the retention manager 220 may determine that it is not necessary to perform a refresh operation. Since the increase in erase/write count means that data is newly stored in the corresponding memory block, it is determined that a change in read voltage is not due to a deterioration in a retention characteristic.

Figure 10:
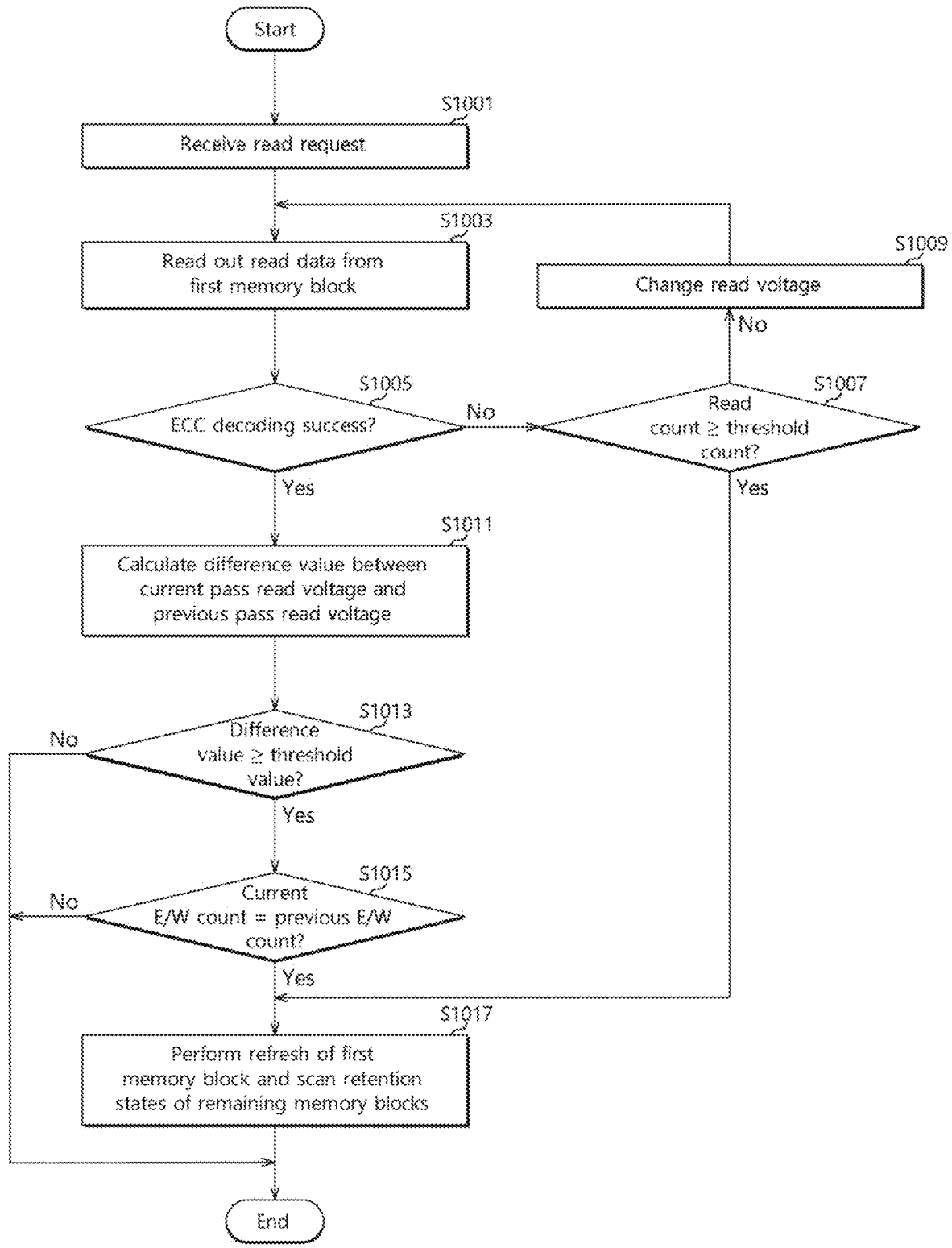
FIG. 10 is a flow chart of a method for operating an electronic apparatus in accordance with an embodiment of the disclosure.

FIG. 10 is a flow chart of a method for operating an electronic apparatus in accordance with an embodiment of the disclosure. In describing the method for operating the electronic apparatus 10 in accordance with the present embodiment with reference to FIG. 10, reference may also be made to at least one among FIGS. 1 to 9.

At step S1001, a read request may be received from the host. The read request received from the host is a read request for the first memory block BLK1 (see FIG. 2B).

At step S1003, the processor 230 of the controller 200 may control the operation of the storage device 100 to perform a read operation for the first memory block BLK1, in response to the read request from the host. The storage device 100 may read out data from the first memory block BLK1 and transmit the read-out data to the controller 200, under the control of the processor 230.

At step S1005, the processor 230 may perform an ECC decoding for the read data received from the storage device 100, by using an ECC (error correction code) engine (not illustrated). The ECC engine may provide the processor 230 with a signal indicating whether the ECC decoding for the read data is a pass (that is, a success) or a fail (that is, a failure). The processor 230 may determine whether the ECC decoding of the read data is a success, based on the signal provided from the ECC engine. If the ECC decoding of the read data is a success (that is, 'Yes' at step S1005), the process may proceed to step S1011. Conversely, if the ECC decoding of the read data is a failure (that is, 'No' at step S1005), the process may proceed to step S1007.

At the step S1007, the processor 230 may determine whether a read operation count for the first memory block BLK1 is equal to or greater than a threshold count. If the read operation count is equal to or greater than the threshold count (that is, 'Yes' at step S1007), the process may proceed to step S1017. If the read operation count is less than the threshold count (that is, 'No' at step S1007), the process may proceed to step S1009.

At the step S1009, the storage device 100 may change a read voltage under the control of the processor 230, may read out data again from the first memory block BLK1 by applying the changed read voltage to the first memory block BLK1, and may provide the processor 230 with the data read out again.

At the step S1011, the processor 230 may drive the retention manager 220 to calculate the difference value between a current pass read voltage and a previous pass read voltage for the first memory block BLK1.

At step S1013, the retention manager 220 may compare the difference value calculated at the step S1011 and a preset threshold value, and may determine whether the difference value is equal to or greater than the threshold value. If the difference value is less than the threshold value (that is, 'No' at step S1013), the read operation for the first memory block BLK1 may end. If the difference value is equal to or greater than the threshold value that is, 'Yes' at step S1013), the process may proceed to step S1015.

At the step S1015, the retention manager 220 may determine whether a current erase/write count and a previous erase/write count for the first memory block BLK1 are equal, by referring to the block state table 245. If the current erase/write count and the previous erase/write count are not equal (that is, 'No' at step S1015), the read operation for the first memory block BLK1 may end. If the current erase/write count and the previous erase/write count are equal (that is, 'Yes' at step S1015), the process may proceed to the step S1017.

At the step S1017, the retention manager 220 determines that it is necessary to perform a refresh operation for the first memory block BLK1, and provides the processor 230 with a signal indicating a determination result. Also, the retention manager 220 determines that it is necessary to scan retention states for all of the remaining memory blocks except the first memory block BLK1, and provides the processor 230 with a signal indicating a determination result.

The processor 230 may control the operation of the storage device 100 to perform a refresh operation for the first memory block BLK1, based on the signals provided from the retention manager 220. Moreover, the processor 230 may control the operation of the storage device 100 to perform a retention state scan operation for the remaining memory blocks, while the electronic apparatus 10 is in an idle state, is booted, or garbage collection (GC) is performed in the storage device 100.

Figure 11:
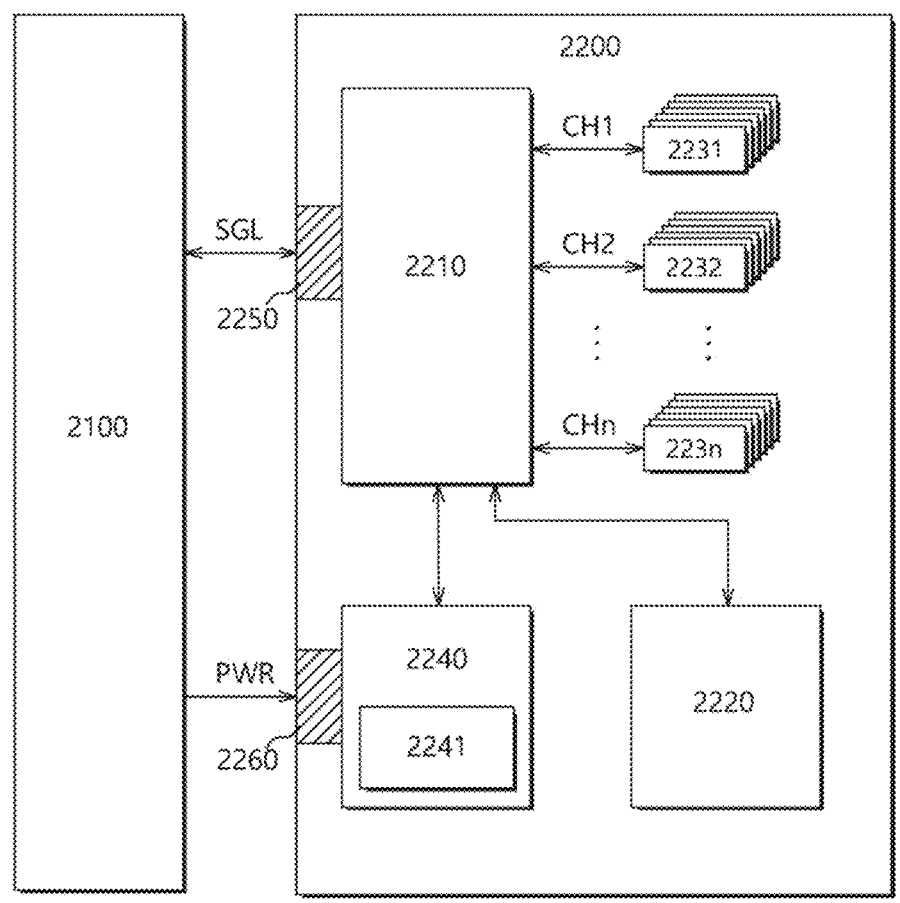
FIG. 11 is a diagram illustrating a data processing system including a solid state drive (SSD) in accordance with an embodiment of the present disclosure.

FIG. 11 is a diagram illustrating a data processing system including a solid state drive (SSD) in accordance with an embodiment of the present disclosure. Referring to FIG. 11, the data processing system 2000 may include a host apparatus 2100 and the SSD 2200.

The SSD 2200 may include a controller 2210, a buffer memory device 2220, nonvolatile memory devices 2231 to 223n, a power supply 2240, a signal connector 2250, and a power connector 2260.

The controller 2210 may control overall operation of the SSD 2220.

The buffer memory device 2220 may temporarily store data in the nonvolatile memory devices 2231 to 223n. The buffer memory device 2220 may temporarily store data read from the nonvolatile memory devices 2231 to 223n. The data temporarily stored in the buffer memory device 2220 may be transmitted to the host apparatus 2100 or to the nonvolatile memory devices 2231 to 223n according to control of the controller 2210.

The nonvolatile memory devices 2231 to 223n may be used as a storage medium of the SSD 2200. The nonvolatile memory devices 2231 to 223n may be coupled to the controller 2210 through a plurality of channels CH1 to CHn. One or more nonvolatile memory devices may be coupled to one channel. The nonvolatile memory devices coupled to the same channel may be coupled to the same signal bus and the same data bus.

The power supply 2240 may provide power PWR input through the power connector 2260 to components within the SSD 2200. The power supply 2240 may include an auxiliary power supply 2241. The auxiliary power supply 2241 may supply the power so that the SSD 2200 is properly terminated even when sudden power-off occurs. The auxiliary power supply 2241 may include large capacity capacitors capable of charging the power PWR.

The controller 2210 may exchange a signal SGL with the host apparatus 2100 through the signal connector 2250. The signal SGL may include a command, an address, data, and other related information such as metadata, count values, and command priority data. The signal connector 2250 may be configured as any of various types of connectors according to an interfacing method between the host apparatus 2100 and the SSD 2200.

Figure 12:
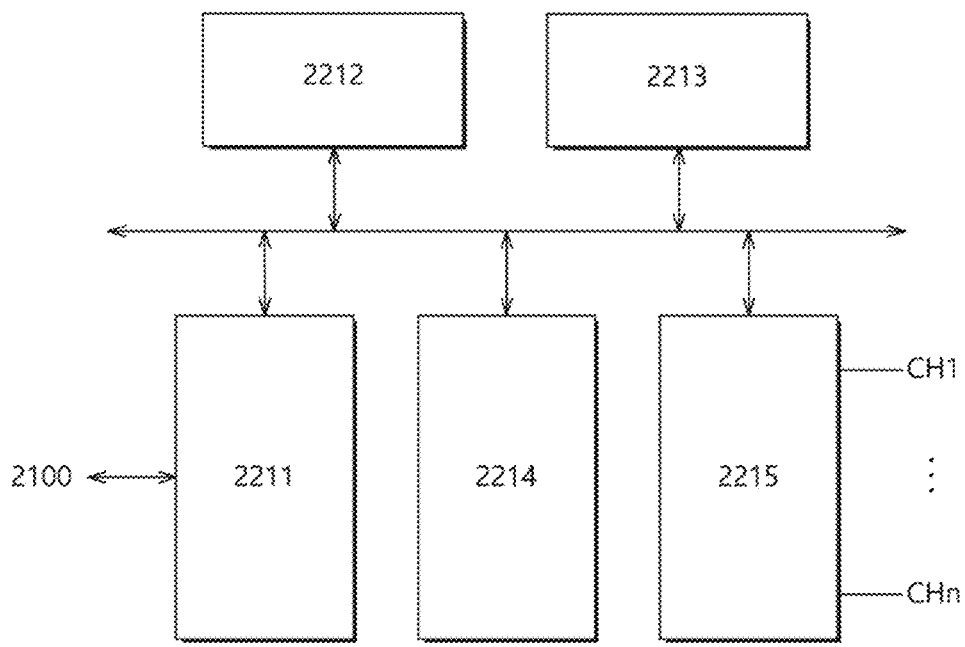
FIG. 12 is a diagram illustrating a controller, such as that illustrated in FIG. 11.

FIG. 12 is a diagram illustrating a controller, such as that illustrated in FIG. 11, in accordance with an embodiment of the present disclosure. Referring to FIG. 12, the controller 2210 may include a host interface 2211, a control component 2212, a random access memory (RAM) 2213, an error correction code (ECC) component 2214, and a memory interface 2215.

The host interface 2211 may perform interfacing between the host apparatus 2100 and the SSD 2200 according to a protocol of the host apparatus 2100. For example, the host interface 2211 may communicate with the host apparatus 2100 through any one among a secure digital protocol, a universal serial bus (USB) protocol, a multimedia card (MMC) protocol, an embedded MMC (eMMC) protocol, a personal computer memory card international association (PCMCIA) protocol, a parallel advanced technology attachment (PATA) protocol, a serial advanced technology attachment (SATA) protocol, a small computer system interface (SCSI) protocol, a serial attached SCSI (SAS) protocol, a peripheral component interconnection (PCI) protocol, a PCI Express (PCI-e or PCIe) protocol, and a universal flash storage (UFS) protocol. The host interface 2211 may perform a disc emulation function such that the host apparatus 2100 recognizes the SSD 2200 as a general-purpose data storage apparatus, for example, a hard disc drive HDD.

The control component 2212 may analyze and process the signal SGL input from the host apparatus 2100. The control component 2212 may control operations of internal functional blocks according to firmware and/or software for driving the SDD 2200. The RAM 2213 may be operated as a working memory for driving the firmware or software.

The ECC component 2214 may generate parity data for the data to be transferred to the nonvolatile memory devices 2231 to 223n. The generated parity data may be stored in the nonvolatile memory devices 2231 to 223n together with the data. The ECC component 2214 may detect errors for data read from the nonvolatile memory devices 2231 to 223n based on the parity data. When detected errors are within a correctable range, the ECC component 2214 may correct the detected errors.

The memory interface 2215 may provide a control signal such as a command and an address to the nonvolatile memory devices 2231 to 223n according to control of the control component 2212. The memory interface 2215 may exchange data with the nonvolatile memory devices 2231 to 223n according to control of the control component 2212. For example, the memory interface 2215 may provide data stored in the buffer memory device 2220 to the nonvolatile memory devices 2231 to 223n or provide data read from the nonvolatile memory devices 2231 to 223n to the buffer memory device 2220.

Figure 13:
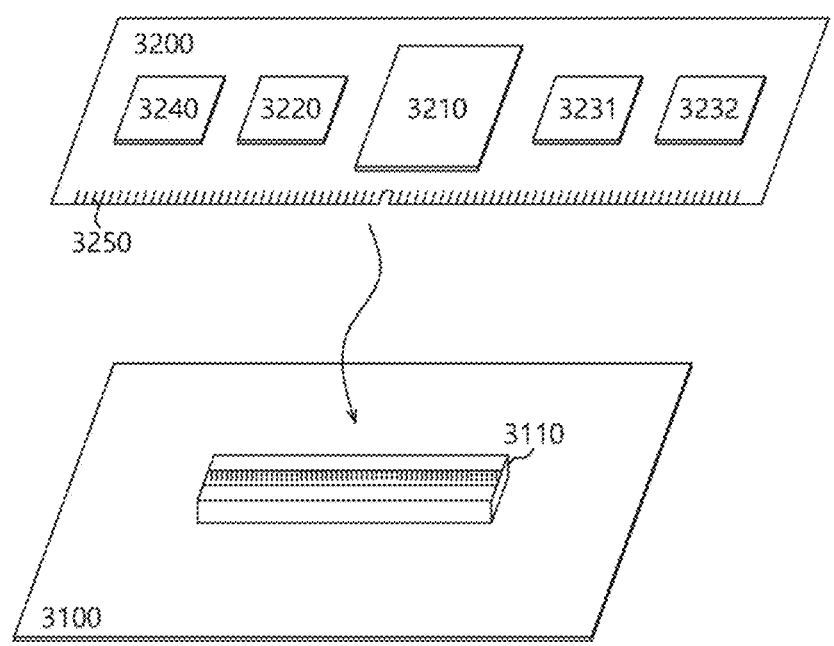
FIG. 13 is a diagram illustrating a data processing system including an electronic apparatus in accordance with an embodiment of the present disclosure.

FIG. 13 is a diagram illustrating a data processing system including an electronic apparatus in accordance with an embodiment. Referring to FIG. 13, the data processing system 3000 may include a host apparatus 3100 and the data storage apparatus 3200.

The host apparatus 3100 may be configured in a board form such as a printed circuit board (PCB). Although not shown in FIG. 13, the host apparatus 3100 may include internal functional blocks configured to perform functions of the host apparatus 3100.

The host apparatus 3100 may include a connection terminal 3110 such as a socket, a slot, or a connector. The data storage apparatus 3200 may be mounted on the connection terminal 3110.

The data storage apparatus 3200 may be configured in a board form such as a PCB. The data storage apparatus 3200 may refer to a memory module or a memory card. The data storage apparatus 3200 may include a controller 3210, a buffer memory device 3220, nonvolatile memory devices 3231 to 3232, a power management integrated circuit (PMIC) 3240, and a connection terminal 3250.

The controller 3210 may control overall operation of the data storage apparatus 3200. The controller 3210 may be configured the same or substantially the same as the controller 2210 illustrated in FIG. 12.

The buffer memory device 3220 may temporarily store data in the nonvolatile memory devices 3231 and 3232. The buffer memory device 3220 may temporarily store data read from the nonvolatile memory devices 3231 and 3232. The data temporarily stored in the buffer memory device 3220 may be transmitted to the host apparatus 3100 or the nonvolatile memory devices 3231 and 3232, according to control of the controller 3210.

The nonvolatile memory devices 3231 and 3232 may be used as a storage medium of the data storage apparatus 3200.

The PMIC 3240 may provide power input through the connection terminal 3250 to components within the data storage apparatus 3200. The PMIC 3240 may manage the power of the data storage apparatus 3200 according to control of the controller 3210.

The connection terminal 3250 may be coupled to the connection terminal 3110 of the host apparatus 3100. Power and a signal such as a command, an address, and data may be transmitted between the host apparatus 3100 and the data storage apparatus 3200 through the connection terminal 3250. The connection terminal 3250 may be configured in any of various forms according to an interfacing method between the host apparatus 3100 and the data storage apparatus 3200. The connection terminal 3250 may be arranged in or on any side of the data storage apparatus 3200.

Figure 14:
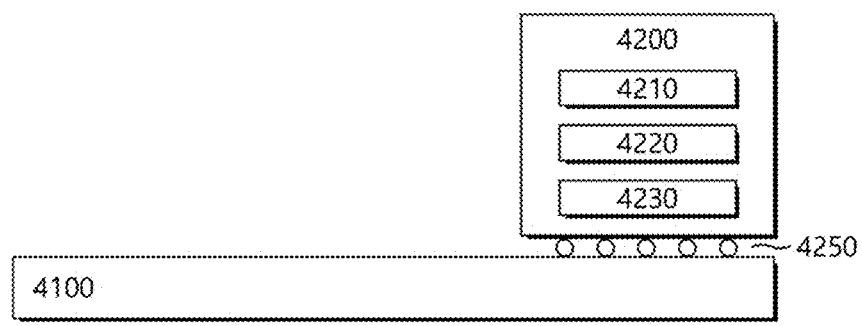
FIG. 14 is a diagram illustrating a data processing system including an electronic apparatus in accordance with an embodiment of the present disclosure.

FIG. 14 is a diagram illustrating a data processing system including an electronic apparatus in accordance with an embodiment. Referring to FIG. 14, the data processing system 4000 may include a host apparatus 4100 and the data storage apparatus 4200.

The host apparatus 4100 may be configured in a board form such as a printed circuit board (PCB). Although not shown in FIG. 14, the host apparatus 4100 may include internal functional blocks configured to perform functions of the host apparatus 4100.

The data storage apparatus 4200 may be configured in a surface mounting packaging form. The data storage apparatus 4200 may be mounted on the host apparatus 4100 through a solder ball 4250. The data storage apparatus 4200 may include a controller 4210, a buffer memory device 4220, and a nonvolatile memory device 4230.

The controller 4210 may control overall operation of the data storage apparatus 4200. The controller 4210 may be configured the same or substantially the same as the controller 2210 illustrated in FIG. 12.

The buffer memory device 4220 may temporarily store data in the nonvolatile memory device 4230. The buffer memory device 4220 may temporarily store data read from the nonvolatile memory device 4230. The data temporarily stored in the buffer memory device 4220 may be transmitted to the host apparatus 4100 or the nonvolatile memory device 4230 through control of the controller 4210.

The nonvolatile memory device 4230 may be used as a storage medium of the data storage apparatus 4200.

Figure 15:
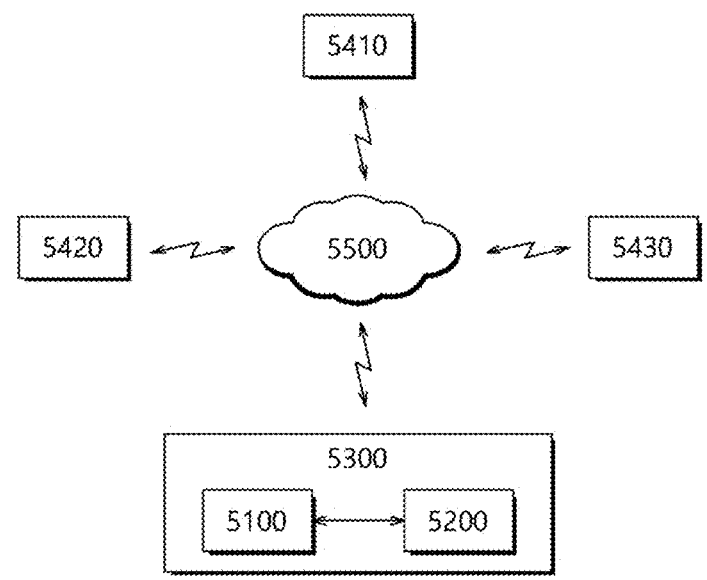
FIG. 15 is a diagram illustrating a network system including an electronic apparatus in accordance with an embodiment of the present disclosure.

FIG. 15 is a diagram illustrating a network system 5000 including a data storage apparatus in accordance with an embodiment. Referring to FIG. 15, the network system 5000 may include a server system 5300 and a plurality of client systems 5410 to 5430 which are coupled through a network 5500.

The server system 5300 may serve data in response to requests from the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host apparatus 5100 and a data storage apparatus 5200. The data storage apparatus 5200 may include the electronic apparatus 10 of FIG. 1, the data storage apparatus 2200 of FIG. 11, the data storage apparatus 3200 of FIG. 13, or the data storage apparatus 4200 of FIG. 14.

Figure 16:
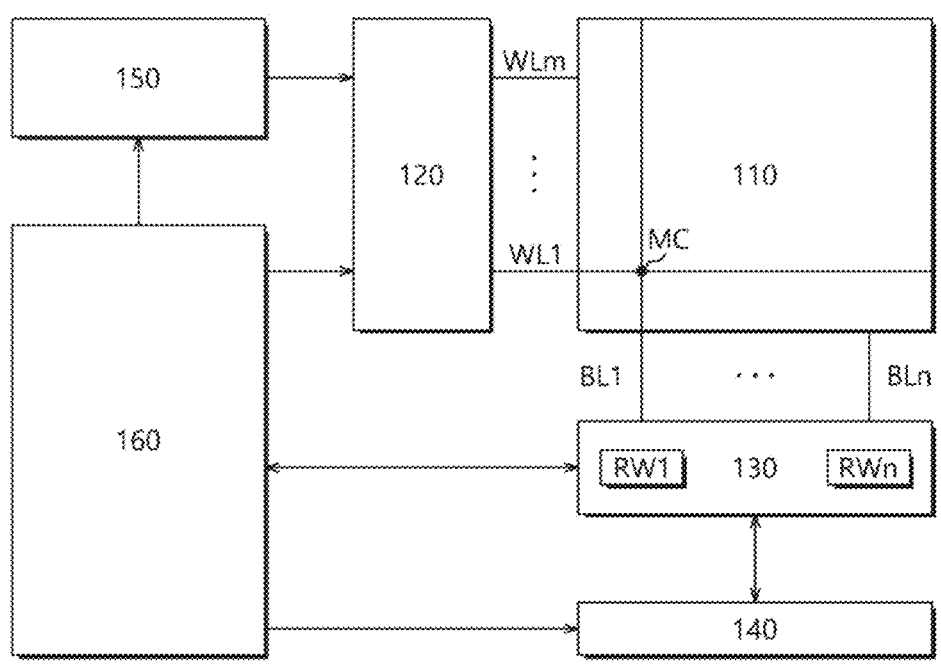
FIG. 16 is a block diagram illustrating a nonvolatile memory device included in a storage device of an electronic apparatus in accordance with an embodiment of the present disclosure.

FIG. 16 is a block diagram illustrating a nonvolatile memory device included in a storage device of an electronic apparatus in accordance with an embodiment. Referring to FIG. 16, the nonvolatile memory device 100 may include a memory cell array 110, a row decoder 120, a column decoder 140, a data read/write block 130, a voltage generator 150, and a control logic 160.

The memory cell array 110 may include memory cells MC arranged in regions in which word lines WL1 to WLm and bit lines BL1 to BLn cross to each other.

The row decoder 120 may be coupled to the memory cell array 110 through the word lines WL1 to WLm. The row decoder 120 may operate through control of the control logic 160. The row decoder 120 may decode an address provided from an external apparatus (not shown). The row decoder 120 may select and drive the word lines WL1 to WLm based on a decoding result. For example, the row decoder 120 may provide a word line voltage provided from the voltage generator 150 to the word lines WL1 to WLm.

The data read/write block 130 may be coupled to the memory cell array 110 through the bit lines BL1 to BLn. The data read/write block 130 may include read/write circuits RW1 to RWn corresponding to the bit lines BL1 to BLn. The data read/write block 130 may operate according to control of the control logic 160. The data read/write block 130 may operate as a write driver or a sense amplifier according to an operation mode. For example, the data read/write block 130 may operate as the write driver configured to store data provided from an external apparatus in the memory cell array 110 in a write operation. In another example, the data read/write block 130 may operate as the sense amplifier configured to read data from the memory cell array 110 in a read operation.

The column decoder 140 may operate though control of the control logic 160. The column decoder 140 may decode an address provided from an external apparatus (not shown). The column decoder 140 may couple the read/write circuits RW1 to RWn of the data read/write block 130 corresponding to the bit lines BL1 to BLn, and data input/output (I/O) lines (or data I/O buffers) based on a decoding result.

The voltage generator 150 may generate voltages used for an internal operation of the nonvolatile memory device 100. The voltages generated through the voltage generator 150 may be applied to the memory cells of the memory cell array 110. For example, a program voltage generated in a program operation may be applied to word lines of memory cells in which the program operation is to be performed. In another example, an erase voltage generated in an erase operation may be applied to well regions of memory cells in which the erase operation is to be performed. In another example, a read voltage generated in a read operation may be applied to word lines of memory cells in which the read operation is to be performed.

The control logic 160 may control overall operation of the nonvolatile memory device 100 based on a control signal provided from an external apparatus. For example, the control logic 160 may control an operation of the nonvolatile memory device 100 such as a read operation, a write operation, and an erase operation of the nonvolatile memory device 100.

While various embodiments have been described above, it will be understood to those skilled in the art that various changes and modifications may be made to the described embodiments without departing from the spirit and scope of the invention as defined in the following claims.

What is claimed is:

1. An electronic apparatus comprising:
    a storage device having a plurality of memory blocks including a first memory block; and
    a controller configured to control the storage device to perform a read operation for the first memory block in response to a read request of a host,
    wherein the controller controls the storage device to perform a refresh operation for the first memory block based on whether there is a difference value between a current pass read voltage and a previous pass read voltage which were applied to the first memory block when performing the read operation, and whether there is a difference between a current erase/write count and a previous erase/write count for the first memory block.

2. The electronic apparatus according to claim 1, wherein the controller comprises:
    a processor configured to control general operations of the controller;
    a memory including a block state table which stores state information for the previous pass read voltage and the previous erase/write count of the first memory block; and
    a retention manager configured to calculate the difference value between the current pass read voltage and the previous pass read voltage,
    compare the calculated difference value with a preset threshold value,
    compare the current erase/write count with the previous erase/write count, and
    provide the processor with a signal indicating a comparison result.

3. The electronic apparatus according to claim 2, wherein the state information comprise the current erase/write count, the previous pass read voltage, and the previous erase/write count.

4. The electronic apparatus according to claim 2, wherein the controller calculates the difference value by driving the retention manager through the processor when the read operation succeeds, compares the calculated difference value with the preset threshold value, and compares the current erase/write count with the previous erase/write count when the difference value is equal to or greater than the preset threshold value.

5. The electronic apparatus according to claim 4, wherein the processor controls the storage device to perform the refresh operation for the first memory block when the current erase/write count and the previous erase/write count are equal.

6. The electronic apparatus according to claim 1, wherein the controller further determines whether a read count for the first memory block is equal to or greater than a preset threshold count when the read operation fails, and further controls the storage device to perform the refresh operation for the first memory block when the read count is equal to or greater than the preset threshold count.

7. The electronic apparatus according to claim 6, wherein, when the read count for the first memory block is less than the preset threshold count, the controller controls the storage device to change a read voltage and then controls the storage device to read out data again from the first memory block by applying the changed read voltage.

8. The electronic apparatus according to claim 1, wherein the controller further controls the storage device to perform a retention state scan operation for each of the plurality of memory blocks except the first memory block when performing the refresh operation for the first memory block.

9. The electronic apparatus according to claim 8, wherein the controller controls the storage device to perform the retention state scan operation while the electronic apparatus is in an idle state, is booted, or a garbage collection (GC) operation is performed in the storage device.

10. A memory system comprising:
    a memory device including a memory block; and
    a controller configured to:
    store a previous pass read voltage, a current erase/write count, and a previous erase/write (EW) count of the memory block; and
    control the memory device to perform a refresh operation to the memory block when a difference between the current pass read voltage and the previous pass read voltage is greater than a predetermined threshold and the current EW count and the previous EW count are equal.

11. An electronic apparatus having data retention protection comprising:
    a data storage device including a plurality of memory blocks; and
    a controller including a retention manager, and configured to control the data storage device to perform a read operation on a first memory block among the plurality of memory blocks in response to a read request from a host,
    wherein the retention manager compares a pass read voltage applied to the first memory block in the current read operation with a stored previous pass read voltage applied to the first memory block during a last previous read operation to determine a voltage difference value when a current read operation is determined to be a success,
    wherein the retention manager determines a current erase/write count for the first memory block and compares the current erase/write count with a stored previous erase/write count for the first memory block when the voltage difference value is greater than or equal to a preset voltage threshold value, and
    wherein the retention manager performs a refresh operation for the first memory block when the current erase/write count is equal to the stored previous erase/write count.

12. The electronic apparatus of claim 11, wherein the controller further includes a processor, wherein the processor determines and stores a read count for the current read operation and compares the read count to a preset read count threshold when the current read operation is determined to be a failure, and wherein the data storage device under control of the controller changes a read voltage applied to the first memory block in the current read operation and re-performs the current read operation based on the changed read voltage when the read count is less than the preset read count threshold.

13. The electronic apparatus of claim 12, wherein the retention manager performs a refresh operation for the first memory block when the read count is greater than or equal to the preset read count threshold.

14. The electronic apparatus of claim 12, wherein the controller further includes:

a block state table for storing the current erase/write count, the stored previous pass read voltage, and the stored previous erase/write count, wherein the retention manager updates the stored previous pass read voltage when the current read operation is determined to be a success.

15. The electronic apparatus of claim 11, wherein the controller further includes a processor, and wherein the processor determines that the current read operation is a success when ECC (error correction code) decoding of data read by the current read operation is a pass.

16. The electronic apparatus of claim 15, wherein the processor determines that the current read operation is a failure when ECC (error correction code) decoding of data read by the current read operation is a fail.

17. The electronic apparatus of claim 11, wherein the retention manager performs a retention state scan operation for each of the plurality of memory blocks except the first memory block.

18. The electronic apparatus of claim 17, wherein the retention state scan operation is performed as a background operation when the electronic apparatus is in an idle state, is booted, or a garbage collection is performed in the data storage device.

* * * * *